United States Patent [19]
Hara et al.

[11] Patent Number: 5,959,732
[45] Date of Patent: Sep. 28, 1999

[54] STAGE APPARATUS AND A STAGE CONTROL METHOD

[75] Inventors: Hideaki Hara; Yutaka Hayashi, both of Kanagawa-ken, Japan

[73] Assignee: Nikon Corporation, Tokyo, Japan

[21] Appl. No.: 08/827,716

[22] Filed: Apr. 8, 1997

[30] Foreign Application Priority Data

Apr. 10, 1996 [JP] Japan ................................ 8-087826
May 28, 1996 [JP] Japan ................................ 8-133203

[51] Int. Cl.$^6$ ........................................ G01B 9/02
[52] U.S. Cl. ........................... 356/358; 356/363; 356/401
[58] Field of Search ................................. 356/351, 358, 356/363, 401

[56] References Cited

U.S. PATENT DOCUMENTS

| | | | |
|---|---|---|---|
| 5,040,431 | 8/1991 | Sakino et al. | 74/479 |
| 5,477,304 | 12/1995 | Nishi | 355/53 |

FOREIGN PATENT DOCUMENTS

| | | |
|---|---|---|
| 8-130179 | 5/1996 | Japan . |
| 9-5463 | 1/1997 | Japan . |

*Primary Examiner*—Robert H. Kim
*Attorney, Agent, or Firm*—Armstrong, Westerman, Hattori, McLeland & Naughton

[57] ABSTRACT

A jacket is provided to surround coils in a stationary member of a linear motor. An inlet of the jacket is directed toward the optical path of a laser beam from a laser interferometer, and a temperature-controlled fluid is circulated through the jacket. Temperature sensors are provided at the outlet and inlet, respectively, of a temperature controller. The temperature of the fluid supplied to the stationary member is controlled so as to become equal to the temperature around the optical path of the laser beam on the basis of the values of temperature measured by the temperature sensors, thereby suppressing fluctuations of air in the optical path of the laser beam. An exhaust groove is provided in a guide bar transport member so as to surround a bearing surface around a gas outlet, and partition walls flush with the bearing surface are provided outside the exhaust groove. The discharge opening of the exhaust groove is provided on the leeward of an environmental air stream, and a temperature sensor is provided at the discharge opening. The temperature of compressed air supplied to the gas outlet is controlled such that the temperature measured by the temperature sensor becomes equal to the temperature of the environmental air stream.

30 Claims, 6 Drawing Sheets

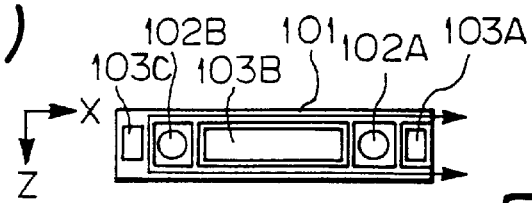
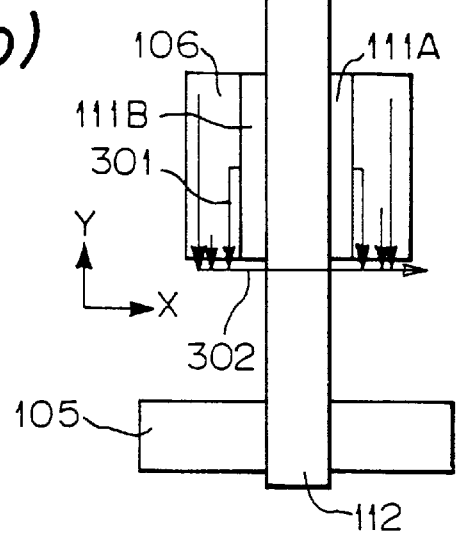
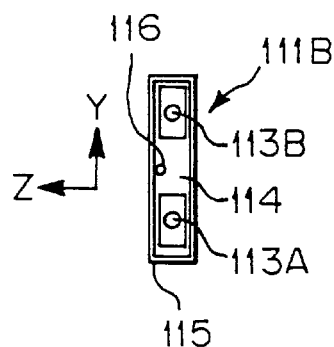
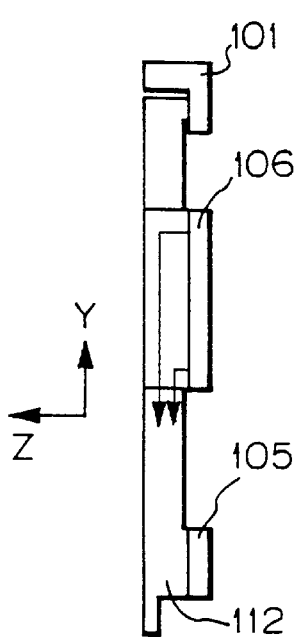
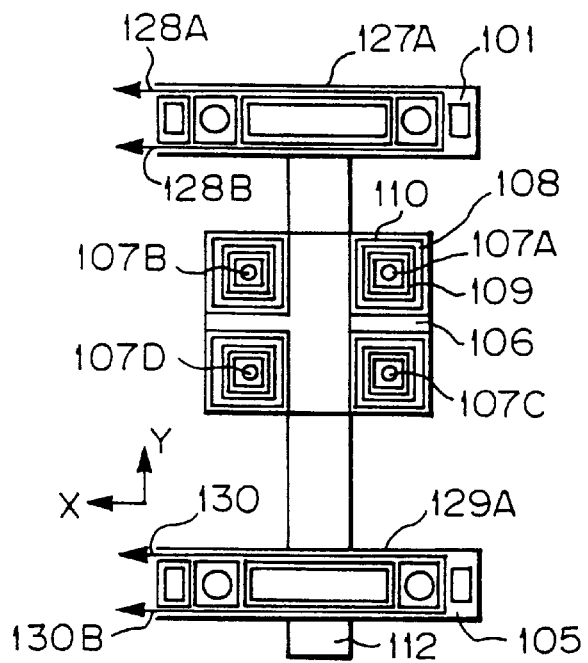

STAGE APPARATUS AND A STAGE CONTROL METHOD

BACKGROUND OF THE INVENTION

The present invention relates to a stage apparatus for positioning a workpiece or other object to be processed or machined. More particularly, the present invention relates to a stage apparatus suitable for use in an exposure system.

In an exposure system used to produce, for example, semiconductor devices, liquid crystal display devices, image pick-up devices (e.g. CCDs), or thin-film magnetic heads, a reticle stage or a wafer stage is used as a stage apparatus for positioning a reticle (or a photomask, etc.) or a wafer (or a glass plate, etc.). These days, exposure systems of the scanning exposure type, e.g. step-and-scan exposure systems, are also used in which a pattern on a reticle is sequentially transferred onto a wafer by synchronously scanning the reticle and the wafer relative to a projection optical system. Stage apparatuses used in such scanning exposure type systems are also demanded to have the function of scanning the reticle and the wafer at a constant speed and with high accuracy.

Reticle and wafer stages for an exposure system are each provided with a laser interferometer (i.e. laser light wave interference type length measuring device) for precisely measuring the position of the stage at the time of positioning or scanning. The laser interferometer measures the position of the stage by applying a laser beam to a moving mirror secured to the stage and receiving the laser beam reflected from the moving mirror. In this case, if there are fluctuations of air in the optical path of the laser beam, an error is introduced into the measured value by the laser interferometer. Such fluctuations of air are, in many cases, caused by a turbulent flow or air or a change in the environmental temperature in the vicinity of the optical path. Therefore, there has been a demand for a method of minimizing a turbulent flow of air and a temperature change in the vicinity of the optical path.

Recently, linear motors have been used in reticle and wafer stages as driving mechanisms for driving the stages at high speed and in a non-contact fashion. A typical linear motor consists essentially of a stationary member secured to a base member and a moving member secured to a member that moves relative to the base member. When the stationary member includes a coil, the moving member includes a magnetic field-generating member, e.g. a magnet, whereas, when the stationary member includes a magnetic field-generating member, the moving member includes a coil. A linear motor of the type wherein a magnetic field-generating member is included in the moving member and a coil is included in the stationary side is called "moving magnet type linear motor". A linear motor of the type wherein a coil is included in the moving member and a magnetic field-generating member is included in the stationary member is called "moving coil type linear motor".

Both the moving magnet type linear motor and the moving coil type linear motor structurally need a wide gap between the coil and the magnetic field-generating member in comparison to the ordinary rotary motors and therefore tend to exhibit a lower efficiency and to generate a larger amount of heat than the ordinary rotary motors.

In many cases, driving coils used in linear motors according to the foregoing prior art have a structure in which the coils are exposed in the air. Accordingly, heat from the coils causes a change in the ambient air temperature. This causes fluctuations of air around the optical path of a laser beam emitted from a laser interferometer that measures the position of the reticle or wafer stage, resulting in errors in the measured values by the laser interferometer. However, the errors have heretofore been within a specified tolerance in most cases. These days, however, the integration degree of semiconductor devices and the like is increasing more and more, and a correspondingly high positioning accuracy is required for exposure systems. Therefore, it is demanded to reduce measuring errors due to local fluctuations of air and other disturbance.

Accordingly, there has recently been proposed a method wherein the area around coils that generate a large amount of heat is covered with a cylindrical container, and a cooling fluid is passed through the container by a temperature controller to prevent a rise in temperature which would otherwise be caused by heat generated from the coils. This method makes it possible to suppress a rise in temperature of the heat-generating portion. However, according to this method, a cooling fluid is simply passed through the heat-generating portion. That is, a cooling fluid is passed in disregard of the position of a laser interferometer, or in a case where a plurality of linear motors are installed, the linear motors are cooled successively by a cooling fluid through a single system of circulating piping. Therefore, the conventional method cannot attain the object to eliminate a change in the ambient temperature of the optical path of the laser beam from the laser interferometer to thereby surely control local fluctuations of air around the optical path.

In view of the above-described circumstances, a first object of the present invention is to provide a stage apparatus that uses a linear motor to drive a movable portion and that measures the position of the movable portion with an interferometer. The stage apparatus is designed to suppress fluctuations of air in the optical path of a light beam emitted from the interferometer due to heat generated from the linear motor, thereby enabling the position of a stage to be measured with high accuracy, and thus allowing the stage to be accurately positioned or moved.

In an exposure system, e.g. stepper, a wafer stage, for example, is used as a device for moving a wafer to a predetermined exposure position. The wafer stage includes an X-axis stage and a Y-axis stage, which are movable in respective directions parallel to X- and Y-axes perpendicularly intersecting each other. These days, particularly, a hydrostatic air guide type stage apparatus that uses a hydrostatic gas bearing is used as a wafer stage for realizing high-speed and high-accuracy positioning. Regarding exposure systems, attention has also been paid to scanning exposure type projection exposure systems such as step-and-scan type exposure systems, in which exposure is carried out by synchronously scanning a reticle and a wafer. In such a scanning exposure type projection exposure system, a hydrostatic air guide type stage apparatus is used not only for a wafer stage but also for a reticle stage. Further, hydrostatic air guide type stage apparatuses are also used for positioning workpieces or other objects to be processed or machined, for example, in precision machine tools or precision measuring machines.

A conventional hydrostatic gas bearing used in such a stage apparatus is schemed to maintain a constant gap between a movable portion and a stationary portion by keeping a constant static pressure between the movable portion and the stationary portion, thereby enabling the movable portion to be moved smoothly at high speed. The conventional hydrostatic gas bearing has a hydrostatic gas outlet and inlet provided in the bearing surface of the movable portion or the stationary portion (there are cases where no inlet is provided). Thus, a constant gap is maintained between the bearing surface and a guide surface facing the bearing surface by the balance of repulsion force produced by blowoff of compressed air supplied from the outside and suction force (or gravity).

In an exposure system, laser interferometers are used to measure the positions of a reticle stage and wafer stage. A laser interferometer applies a laser beam to a moving mirror secured to a movable portion to measure an amount of displacement of the movable portion. In this case, if there are fluctuations of air in the optical path of the laser beam, an error is introduced into the measured value by the laser interferometer. Therefore, measures have heretofore been taken to suppress the fluctuations of air in the optical path of the laser beam. For example, temperature-controlled air is supplied to the surroundings of the optical path of the laser beam.

A conventional stage apparatus using a hydrostatic gas bearing has a structure in which the compressed air blown is constantly released as it is to the periphery of the air outlet provided in the bearing surface. However, in general factories, the temperature of compressed air or the like that is supplied to the hydrostatic gas bearing is not satisfactorily controlled. Even if the compressed air is at room temperatures, when it is blown out from the air outlet provided in the bearing surface, the air pressure reduces to the atmospheric pressure, and the temperature of the air is undesirably lowered by adiabatic cooling. Accordingly, the ambient temperature of the workpiece lowers below the desired temperature. Consequently, it is likely that a positioning error or a machining error will occur on account of the contraction of the workpiece, the stage, etc. As has been stated above, many of stages for exposure systems use laser interferometers that use laser beams to measure coordinate positions. Accordingly, it is necessary in order to perform accurate coordinate measurement to suppress a turbulent flow of air in the optical path of a laser beam emitted from such a laser interferometer and a temperature change in the optical path. However, if air different in temperature from the environmental air is discharged from a hydrostatic gas bearing, the air stream in the optical path of the laser beam is made turbulent. This causes temperature variations in the optical path, resulting in a degradation of the measuring accuracy of the laser interferometer.

Compressed air to be supplied to a hydrostatic gas bearing is not satisfactorily cleaned in general factories. Even air that is cleaned to a high degree cannot avoid mixing of fine foreign substances. Therefore, the workpiece may be contaminated by fine foreign substances or chemical substances released into the air from the hydrostatic gas bearing. It is necessary to prevent mixing of such foreign substances particularly in factories where a high level of cleanliness is required to produce semiconductor substrates, liquid crystal substrates, etc.

In view of the above-described circumstances, an object of the present invention is to provide a stage apparatus designed so that when a hydrostatic gas bearing is used, the amount of air released irregularly to the surroundings of a bearing surface is minimized to suppress contamination on a stage and to minimize a change in the environmental temperature. A second object of the present invention is to provide a stage apparatus designed so that when an interferometer is used in combination with a hydrostatic gas bearing, the measuring accuracy of the interferometer is improved to accurately measure the position of a stage, thereby enabling the stage to be positioned or moved with high accuracy.

SUMMARY OF THE INVENTION

A stage apparatus according to the present invention includes a movable member; a linear motor that drives the movable member in a predetermined direction; an interferometer that applies a light beam to the movable member to measure the position of the movable member in the predetermined direction; and a fluid supply device that supplies a temperature-controlled fluid to the linear motor from a side thereof closer to the optical path of the light beam from the interferometer such that the fluid flows around a driving coil of the linear motor.

By virtue of the above-described arrangement of the stage apparatus according to the present invention, a temperature-controlled fluid is supplied to the linear motor from a side thereof closer to the optical path of the light beam emitted from the interferometer. Accordingly, the gas temperature at a portion of the linear motor in the vicinity of the optical path of the light beam can be readily controlled to a desired temperature of the optical path of the light beam by using the fluid before the temperature thereof is raised by the driving coil. For example, if the temperature of the fluid to be supplied to the linear motor is set to a level close to the desired temperature of the optical path of the light beam, the temperature of the linear motor in the vicinity of the optical path of the light beam is maintained substantially at the desired temperature, and thus fluctuations of air in the optical path of the light beam from the interferometer are favorably suppressed. Accordingly, the position of the movable member can be measured with high accuracy by the interferometer, and the movable member can be positioned accurately.

By absorption of heat from the driving coil, the temperature of the fluid rises, and a temperature difference is produced between the temperature of the fluid at a fluid inlet of the linear motor and the temperature of the fluid at a fluid outlet of the linear motor. As a result, a temperature gradient is produced in the longitudinal direction of the linear motor. In this case, however, a gas stream induced by the temperature gradient flows from an end of the linear motor on a side thereof closer to the optical path of the light beam from the interferometer toward the other end of the linear motor on the opposite side. Usually, the whole stage apparatus is placed in an overall air-conditioned environment, and the system is set so that a gas stream produced by the overall air conditioning (the gas stream will be hereinafter referred to as "environmental gas stream") flows from a side of the system closer to the optical path of the light beam from the interferometer toward the stage apparatus. Accordingly, the flow direction of the gas stream induced by the temperature gradient on the surface of the linear motor is coincident with the flow direction of the environmental gas stream. Therefore, no turbulence will occur in the gas stream.

The stage apparatus may have a plurality of linear motors to drive the movable member in the predetermined direction, and the fluid supply device may be arranged to supply the temperature-controlled fluid to the linear motors in parallel from a side of each linear motor closer to the optical path of the light beam emitted from the interferometer. By doing so, a temperature gradient similar to the above occurs in the longitudinal direction of each of the linear motors. Because the temperature gradient is such that the temperature becomes higher as the distance from the optical path of the light beam increases toward an area where the light beam from the interferometer does not pass, a gas stream induced by the temperature gradient is an orderly stream flowing in the same direction as the environmental gas stream.

Therefore, it is possible to suppress fluctuations of air in the optical path of the light beam.

The linear motor may be a moving magnet type linear motor. In this case, the driving coil is incorporated in the stationary member. Therefore, it becomes easy to route piping for a fluid supplied to cool the driving coil.

A stage control method according to the present invention includes the step of driving a movable member in a predetermined direction by a linear motor, and while doing so, applying a light beam to the movable member from an interferometer to measure the position of the movable member in the predetermined direction, and the step of supplying a temperature-controlled fluid to the linear motor from a side thereof closer to the optical path of the light beam from the interferometer such that the fluid flows around a driving coil of the linear motor.

The stage control method according to the present invention may include the step of driving the movable member in the predetermined direction by a plurality of linear motors, and the step of supplying the temperature-controlled fluid to the linear motors in parallel from a side of each linear motor closer to the optical path of the light beam from the interferometer.

A stage apparatus according to another aspect of the present invention includes a first member having a guide surface; a second member having a bearing surface facing the guide surface; a hydrostatic gas bearing that blows compressed air over the guide surface from a gas outlet provided in the bearing surface, so that the first member and the second member are moved relative to each other through the hydrostatic gas bearing; and an exhaust groove for discharging a gas which is provided around the gas outlet provided in the bearing surface.

By virtue of the above-described arrangement of the stage apparatus according to the present invention, an exhaust groove for discharging a gas is provided around the gas outlet. Therefore, the gas blown out of the gas outlet is discharged in a desired direction through the exhaust groove. Accordingly, the amount of gas irregularly released directly to the surroundings of the bearing surface reduces. Therefore, even when a hydrostatic gas bearing is used, contamination of the stage apparatus by the discharged gas is suppressed, and a change in the environmental temperature is minimized.

In this case, the bearing surface may be provided with partition walls flush with the bearing surface such that the partition walls face each other across the exhaust groove. With this arrangement, the amount of gas released irregularly from a gap between the guide surface of the first member and the bearing surface further reduces.

In a case where a temperature-controlled gas stream is supplied to the stage apparatus in a predetermined direction, the discharge opening of the exhaust groove may be provided on the leeward of the temperature-controlled gas stream. By virtue of this arrangement, it is possible to suppress the turbulence of gas stream and temperature change caused by the gas discharged from the exhaust groove.

It is also possible to provide a temperature sensor that measures the temperature of the gas discharged from the exhaust groove and to control the temperature of a compressed gas source for the hydrostatic gas bearing on the basis of the value of temperature measured by the temperature sensor such that the temperature of the gas discharged from the exhaust groove becomes equal to the temperature of the temperature-controlled gas stream. By doing so, the exhaust gas is discharged at a temperature equal to that of the temperature-controlled gas stream. Accordingly, a temperature change of the gas stream can be further reduced.

The arrangement may be such that the stage apparatus is further provided with an interferometer that applies a light beam to at least one of the first and second members to detect a relative displacement between the two members, and that the gas discharged from the exhaust groove is released to a position away from the optical path of the light beam from the interferometer. By virtue of this arrangement, fluctuations of air in the optical path of the light beam from the interferometer reduce, and thus measuring errors of the interferometer reduce. Accordingly, the first and second members can be positioned relative to each other with high accuracy.

A stage control method according to another aspect of the present invention includes the step of moving a first member having a guide surface and a second member having a bearing surface facing the guide surface relative to each other while blowing compressed air over the guide surface from a gas outlet provided in the bearing surface between the first member and the second member, and the step of discharging a gas from an exhaust groove provided around the gas outlet in the bearing surface during the above step of moving the first and second members relative to each other.

The stage control method may further include the step of supplying a temperature-controlled gas stream to the first and second members in a predetermined direction, and the step of discharging a gas from the exhaust groove on the leeward of the temperature-controlled gas stream.

The stage control method may further include the step of measuring the temperature of the gas discharged from the exhaust groove, and the step of controlling the temperature of a compressed gas source on the basis of the measured temperature such that the temperature of the gas discharged from the exhaust groove becomes equal to the temperature of the temperature-controlled gas stream.

The stage control method may further include the step of applying a light beam from an interferometer to at least one of the first and second members to detect a relative displacement between the two members, and the step of releasing the gas discharged from the exhaust groove to a position away from the optical path of the light beam from the interferometer.

BRIEF DESCRIPTION OF THE DRAWINGS

FIGS. 5(a) to 5(e) are diagrams for illustrating the arrangement of each of hydrostatic gas bearings used in the wafer stage shown in FIG. 4, together with the flow of discharged air.

DETAILED DESCRIPTION OF PREFERRED EMBODIMENTS

One embodiment of the stage apparatus according to the present invention will be described below with reference to the accompanying drawings. In this embodiment, the present invention is applied to a one-axis stage apparatus.

Figure 1:
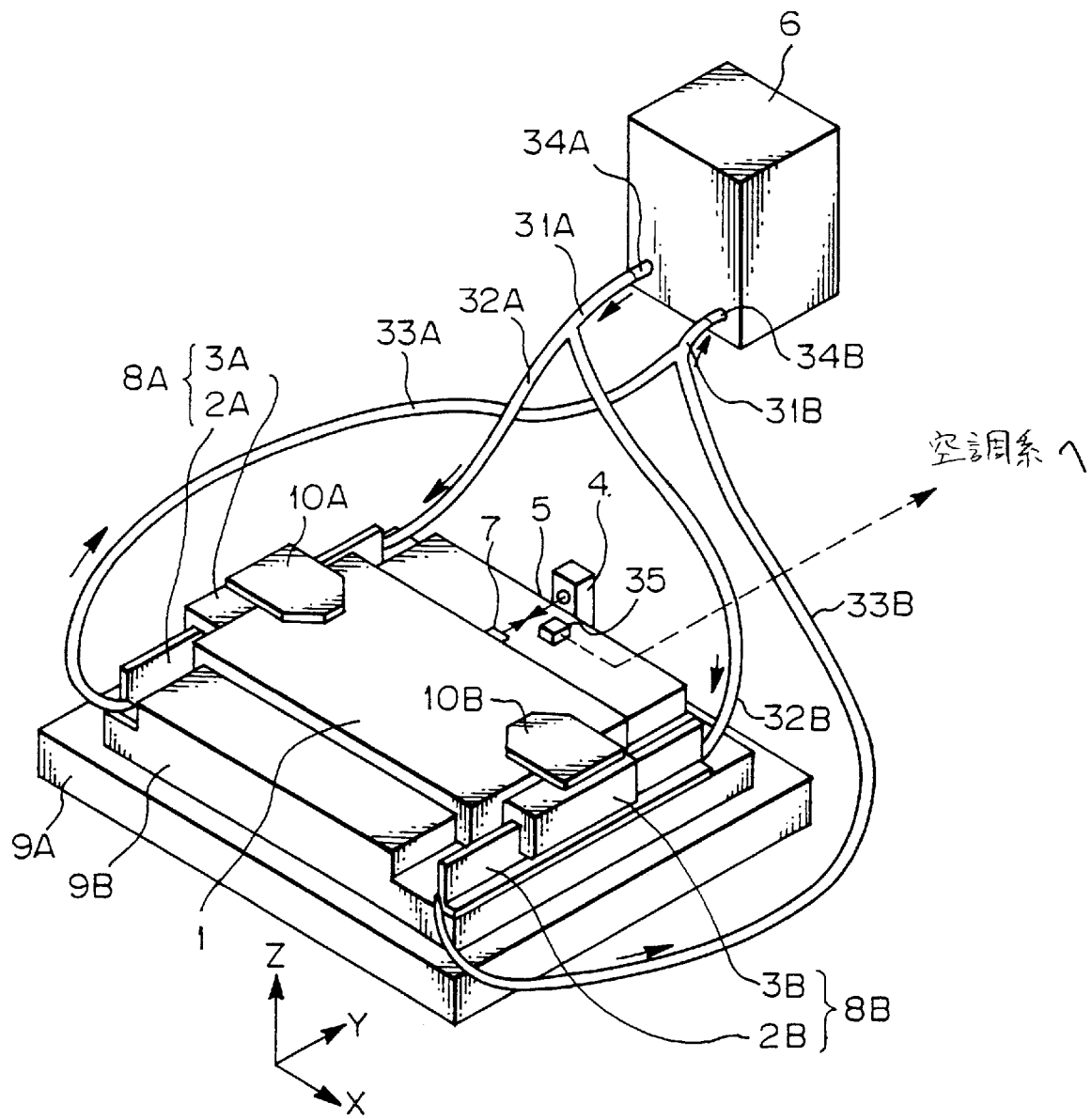
FIG. 1 is a perspective view showing one embodiment of the stage apparatus according to the present invention.

FIG. 1 is a perspective view schematically illustrating the arrangement of the stage apparatus according to this embodiment. Referring to FIG. 1, a surface plate 9A has a stage base 9B fixed thereon. A stage 1 is mounted on the stage base 9B. The stage 1 is driven by two moving magnet type linear motors 8A and 8B. In the following description, an XY-coordinate system is defined in a plane parallel to the surface of the stage 1, and a Z-axis is taken in a direction perpendicular to the XY-coordinate system.

The linear motor 8A has a stationary member 2A installed on an end in the direction −X of the stage base 9B so as to extend parallel to the Y-axis. The linear motor 8A further has a moving member 3A with a U-shaped sectional configuration extending over the stationary member 2A such that two parallel-extending end portions of the moving member 3A sandwich the stationary member 2A from above it. The top of the moving member 3A and the top of the −X end portion of the stage 1 are connected through a securing frame 10A. By supplying an electric current to coils incorporated in the stationary member 2A, the moving member 3A, which includes a magnetic field-generating member, is driven in the state of being levitated over the stationary member 2A, thereby moving the stage 1 in the direction Y through the securing frame 10A fixed to both the moving member 3A and the stage 1. The linear motor 8B similarly has a stationary member 2B fixed to an end in the direction +X of the stage base 9B so as to extend parallel to the Y-axis, and a moving member 3B with a U-shaped sectional configuration installed such that two parallel-extending end portions of the moving member 3B sandwich the stationary member 2B from above it. The linear motor 8B drives the stage 1 to move in the direction Y through a securing frame 10B fixed to both the moving member 3B and the stage 1. Usually, the directions of the electric currents supplied to the linear motors 8A and 8B are controlled such that the linear motors 8A and 8B apply driving forces to the stage 1 in the same direction.

A moving mirror 7 is fixed on an end in the direction +Y of the stage 1. A laser interferometer 4 is installed on the +Y end of the stage base 9B at a position facing the moving mirror 7. A laser beam 5 from the laser interferometer 4 is applied to the moving mirror 7, and the reflected beam from the moving mirror 7 is received by the laser interferometer 4 to measure the position of the stage 1 in the direction Y. In addition, a temperature sensor 35 is installed in the vicinity of the optical path of the laser beam 5 to measure the temperature of air in the vicinity of the optical path. The result of measurement by the temperature sensor 35 is supplied to an air-conditioning system (not shown) that supplies temperature-controlled air to the surroundings of the stage apparatus according to this embodiment.

In addition, the stage apparatus according to this embodiment is provided with a temperature controller 6 for controlling the temperature of the stationary members 2A and 2B. A fluid 29 (see FIG. 3) whose temperature is controlled in the temperature controller 6 is supplied into the stationary members 2A and 2B, which include the coils of the linear motors 8A and 8B, from respective inlets of the stationary members 2A and 2B through a supply piping 31A and two supply branch pipes 32A and 32B branched from the supply piping 31A. In this case, the inlets of the stationary members 2A and 2B are provided on the respective sides (i.e. side surfaces facing in the direction +Y) of the stationary members 2A and 2B that are closer to the laser interferometer 4.

Figure 3:
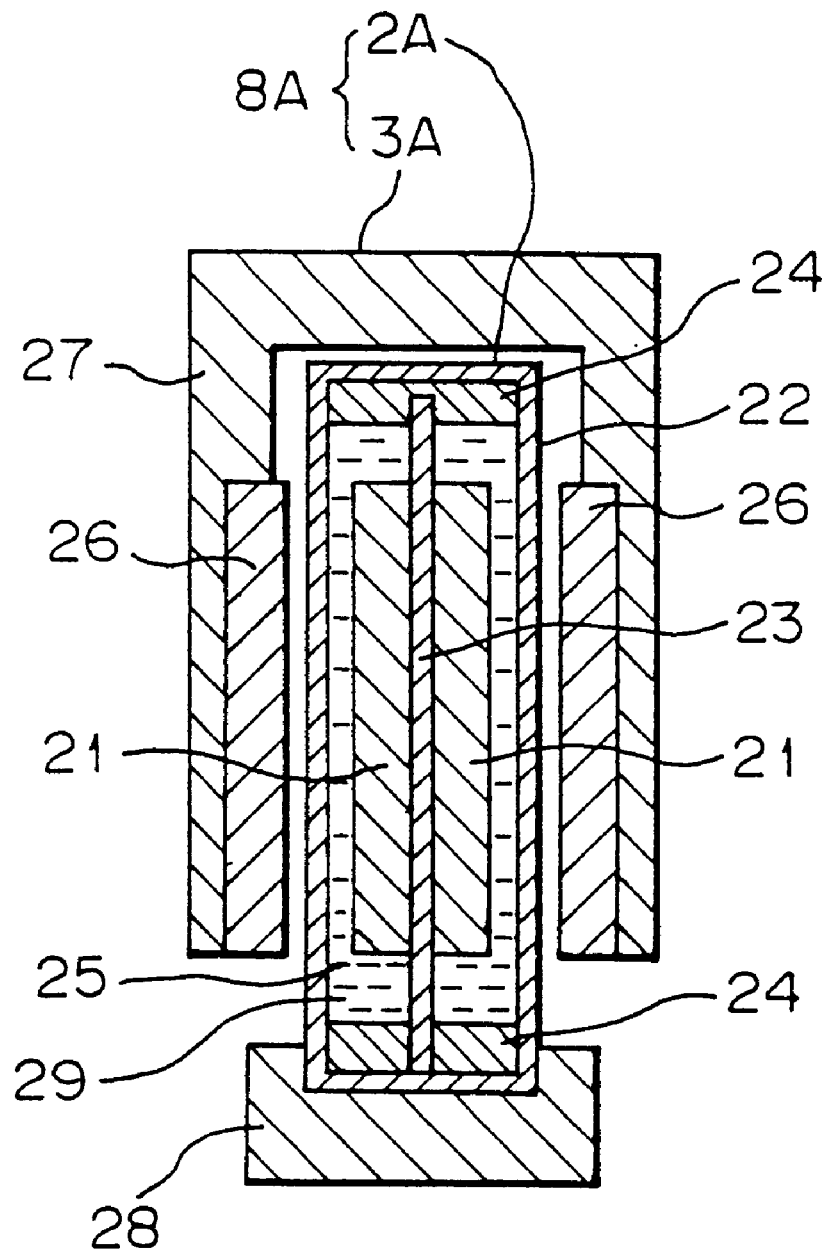
FIG. 3 is a sectional view of a moving magnet type linear motor shown in FIG. 1.

FIG. 3 is a sectional view of the linear motor 8A shown in FIG. 1. Referring to FIG. 3, the moving member 3A of the linear motor 8A has a pair of magnets 26 secured to the opposing inner sides of a magnet support member (yoke) 27 having a U-shaped sectional configuration. The stationary member 2A has a jacket 22 fixed on a stationary member support 28. The jacket 22 is made of a stainless steel (e.g. SUS27) or aluminum in the shape of a tube having a rectangular sectional configuration. The stationary member 2A further has coils 21 fitted on both sides of a support plate 23. The support plate 23 is secured to a pair of upper and lower support members 24 made of a resin material, which are bonded to the top and bottom inner sides of the jacket 22. A fluid 29 for temperature control flows through a flow path 25 defined in the tubular jacket 22, which surrounds the coils 21, to absorb heat generated from the coils 21.

The fluid 29 supplied from the branch pipe 32A, shown in FIG. 1, into the jacket 22 through an inlet of the jacket 22 is heated by absorbing heat from the coils 21, and the heated fluid 29 is discharged to a discharge branch pipe 33A (shown in FIG. 1) communicated with the jacket 22 from an outlet of the jacket 22 provided on a side thereof remote from the laser interferometer 4. Referring to FIG. 1, the other linear motor 8B has an arrangement similar to that of the linear motor 8A. The fluid 29 supplied from the branch pipe 32B into the stationary member 2B through an inlet provided in the jacket of the stationary member 2B is heated by absorbing heat from the coils, and the heated fluid 29 is discharged to a discharge branch pipe 33B communicated with the jacket from an outlet of the jacket provided on a side thereof remote from the laser interferometer 4. The fluid 29 discharged from each of the outlets of the stationary members 2A and 2B of the linear motors 8A and 8B returns to the temperature controller 6 through each of the discharge branch pipes 33A and 33B and through a discharge piping 31B into which the branch pipes 33A and 33B are integrated together. In the temperature controller 6, the fluid 29 is temperature-controlled again and recirculated to the stationary members 2A and 2B.

A temperature sensor 34A for detecting the temperature of the fluid 29 supplied to the linear motors 8A and 8B is installed at an outlet of the temperature controller 6 that is communicated with the supply piping 31A. The temperature sensor 34A is inserted into the supply piping 31A. Similarly, a temperature sensor 34B for detecting the temperature of the fluid 29 heated by the heat from the coils is inserted into the discharge piping 31B at an inlet of the temperature controller 6 that is communicated with the discharge piping 31B. Results of measurement by the temperature sensors 34A and 34B are supplied to a control system incorporated in the temperature controller 6. The control system controls the temperature and flow rate of the fluid 29 on the basis of the results of measurement by the temperature sensors 34A and 34B. In this embodiment, the temperature sensor 34A for measuring the temperature of the temperature-controlled fluid 29 is disposed at the outlet of the temperature controller 6. However, it is conceivable that the temperature of the fluid 29 changes during the flow through the supply branch pipes 32A and 32B. Therefore, the arrangement may be such that temperature sensors are provided near the fluid inlets of the stationary members 2A and 2B, respectively, and that the temperature of the fluid 29 at the outlet of the temperature controller 6 is controlled on the basis of results of measurement by the two temperature sensors, and further that flow control valves are provided respectively for the supply branch pipes 32A and 32B to control the flow rate of the fluid 29, thereby controlling the surface temperature of the coils of the linear motors 8A and 8B.

It should be noted that in a case where the insulation properties of the coils 21 are good, water of high purity, e.g. pure water, can be used as the fluid 29. It is also possible to use an inert gas, e.g. helium (He). However, it is desirable to use as the fluid 29 a liquid that is not corrosive to the coils 21, the jackets 22, etc. and that has a low electrical conductivity and excellent heat transfer properties and further that is chemically inert. In this embodiment, therefore, a fluorine-containing inert liquid is used as the fluid 29, e.g. Florinert (trade name; manufactured by 3M).

Next, the operation of the stage apparatus according to this embodiment will be described. Although the linear motor 8A is taken as an example in the following description, the same is true of the linear motor 8B.

In this embodiment, while the stage 1 shown in FIG. 1 is being driven, the temperature $T_L$ of air around the optical path of the laser beam 5 from the laser interferometer 4 is constantly measured by the temperature sensor 35. The temperature $T_L$ measured by the temperature sensor 35 is sent to the air-conditioning system (not shown). The air-conditioning system controls the temperature of air to be supplied such that the measured temperature $T_L$ approaches the desired temperature $T_o$.

The desired temperature $T_o$ has previously been set in the temperature controller 6. The temperature controller 6 effects control such that the temperature of the fluid 29 before it is supplied to the linear motor 8A, that is, the temperature $T_R$ measured by the temperature sensor 34A, becomes equal to the desired temperature $T_o$, and while doing so, the temperature controller 6 drives a pump incorporated in the temperature controller 6 to supply the fluid 29 to the linear motor 8A. When the temperature of the fluid 29 having passed through the linear motor 8A, which is measured by the temperature sensor 34B, is excessively high, the temperature controller 6 prevents an excessive rise in temperature by increasing the flow rate of the fluid 29, for example.

Excepting a particular case where the air stream is made turbulent by a physical cause, turbulence of the air stream in the optical path of the laser beam 5 from the laser interferometer 4 is induced by a temperature difference according to position between the temperature of the stage apparatus and the temperature of the environment of the stage apparatus (the temperature difference will be hereinafter referred to as "positional temperature difference"). More specifically, if a stream of air is induced by a positional temperature difference and there is an obstacle to the flow of air in the vicinity of the optical path of the laser beam 5, the air stream is made turbulent by the obstacle, resulting in fluctuations of air in the optical path. The greater the temperature change at a position close to the optical path, the more turbulent the air stream in the optical path. Therefore in this embodiment, the jacket 22 is provided to cover the coils 21 included in the stationary member 2A of the linear motor 8A, which generate a particularly large amount of heat, and the fluid 29 controlled to a predetermined temperature is circulated through the jacket 22, thereby preventing the heat generated from the coils 21 from producing an adverse effect on the external environment.

If a temperature-controlled fluid is simply circulated through an area around the coils without taking into consideration a temperature change at a portion close to the laser interferometer as in the conventional practice, the temperature at a position of the linear motor 8A close to the laser interferometer cannot precisely be controlled, and heat from the linear motor 8A induces a positional temperature difference in the vicinity of the optical path of the laser beam 5, causing the air stream to become turbulent. In this embodiment, however, the temperature of the fluid 29 supplied to the linear motor 8A from the temperature controller 6 is controlled to a level approximately the same as the desired temperature in the vicinity of the optical path of the laser beam 5. Therefore, it is possible to suppress a change in the surface temperature of the linear motor 8A caused by heat generated from the coils 21. Moreover, the fluid 29 is supplied to the linear motor 8A from an end of the linear motor 8A closer to the laser interferometer 4. Consequently, even if the fluid 29 is heated by heat generated from the coils 21 and thus a temperature gradient occurs in the longitudinal direction (direction Y) of the surface of the linear motor 8A, the surface of the linear motor 8A on a side thereof closer to the optical path of the laser beam 5 from the laser interferometer 4 is maintained at approximately the same temperature as the atmospheric temperature. Accordingly, it is possible to reduce a temperature change in the vicinity of the optical path of the laser beam 5 from the laser interferometer 4.

A stream of air induced by a temperature gradient occurring in the longitudinal direction of the linear motor 8A flows from the side of the stage base 9B where the laser interferometer 4 is installed toward the opposite side of the stage base 9B. In this case, the temperature gradient in the longitudinal direction of the linear motor 8B is similar to that in the case of the linear motor 8A. Therefore, the air stream induced over the stage 1 does not flow in the direction X but flows orderly as a whole from the side where the laser interferometer 4 is installed toward the side remote from the laser interferometer 4 (i.e. in the direction−Y). Usually, the system is so set that an air stream controlled by the overall air conditioning for the stage apparatus (the air stream will be hereinafter referred to as "environmental air stream") flows in the direction −Y from the rear side of the laser interferometer 4 (i.e. the +Y side as viewed in the figure) toward the stage 1. Therefore, the direction of the air stream induced by the temperature gradients on the surfaces of the linear motors 8A and 8B is coincident with the direction of the environmental air stream. Consequently, the air in the optical path of the laser beam 5 is made only slightly turbulent. Accordingly, fluctuations of air in the optical path of the laser beam 5 are favorably suppressed, and the position of the stage 1 can be accurately measured by the laser interferometer 4. Thus, the stage 1 can be accurately positioned on the basis of the measured value by the laser interferometer 4.

Next, another embodiment of the stage apparatus according to the present invention will be described with reference to FIG. 2. In this embodiment, the present invention is applied to a wafer stage for positioning a wafer in an exposure system.

Figure 2:
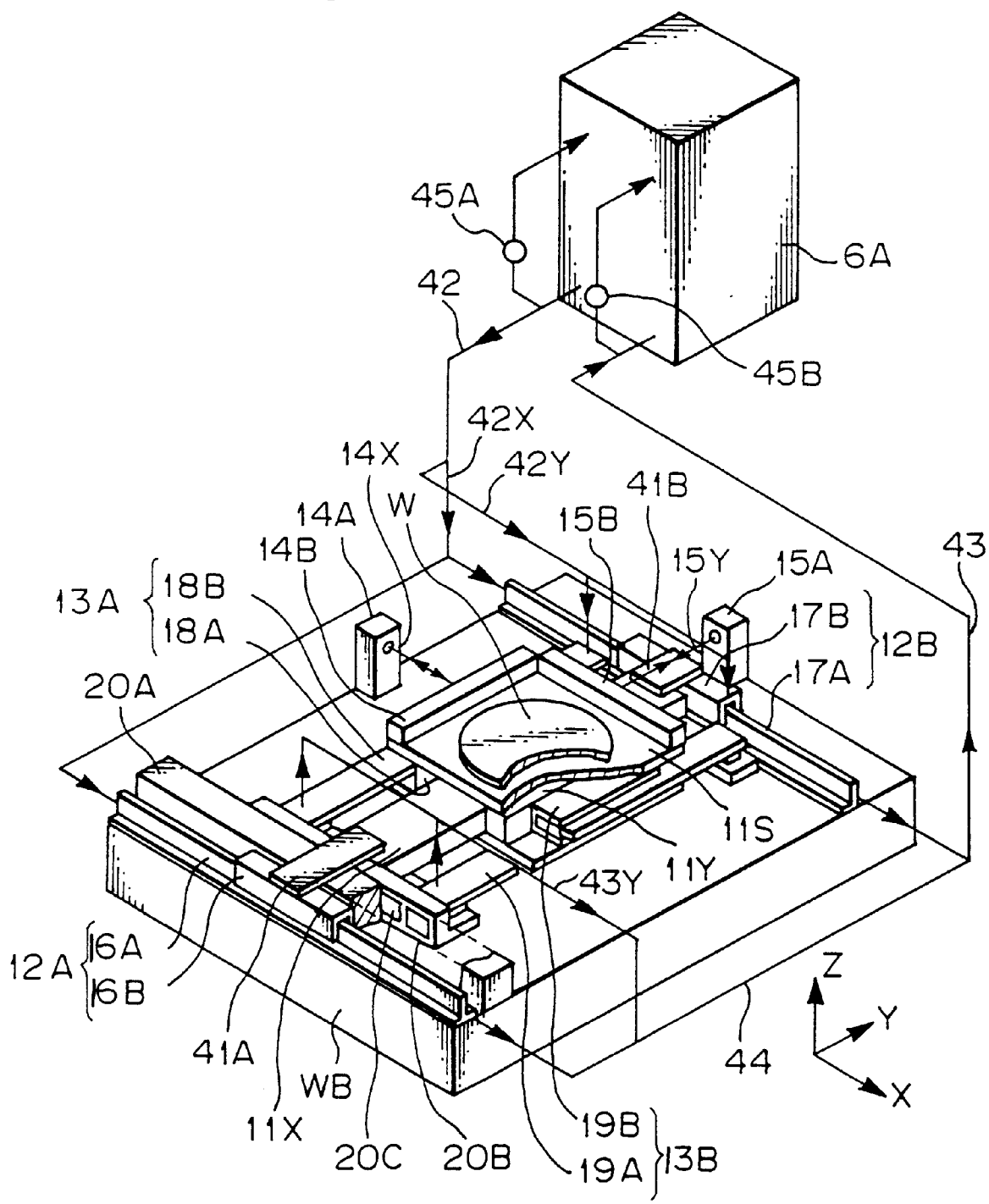
FIG. 2 is a partially-cutaway perspective view showing one embodiment in which the stage apparatus according to the present invention is applied to a two-axis wafer stage.

FIG. 2 is a partially-cutaway perspective view showing the arrangement of the wafer stage according to this embodiment. Referring to FIG. 2, a sample table 11S is held on a Y-stage 11Y. A wafer W is mounted over the sample table 11S through a wafer holder (not shown). A circuit pattern formed on a reticle (not shown) is transferred onto the wafer W by exposure process. The wafer stage is a two-axis stage apparatus having an X-axis and a Y-axis. The wafer stage includes an X-stage 11X driven in the direction X over a wafer base WB; the Y-stage 11Y, which is driven in the direction Y over the X-stage 11X; and the sample table 11S. A moving mirror 15B is fixed on an end in the direction +Y of the sample table 11S. A laser interferometer 15A is installed on an end in the direction +Y of the wafer base WB at a position facing the moving mirror 15B. The laser interferometer 15A applies a laser beam 15Y to the moving mirror 15B and receives the reflected beam from the moving mirror 15B to measure the position in the direction Y of the sample table 11S (i.e. the wafer W). A moving mirror 14B is fixed on an end in the direction −X of the sample table 11S, and a laser interferometer 14A is installed on an end in the direction −X of the wafer base WB at a position facing the moving mirror 14B. The laser interferometer 14A applies a laser beam 14X to the moving mirror 14B and receives the reflected beam from the moving mirror 14B to measure the position in the direction X of the sample table 11S (i.e. the wafer W).

The X-stage 11X is driven in the direction X over the wafer base WB by a combination of a linear motor 12A having a stationary member 16A and a moving member 16B and a linear motor 12B having a stationary member 17A and a moving member 17B. Similarly, the Y-stage 11Y is driven in the direction Y over the X-stage 11X by a combination of a linear motor 13A having a stationary member 18A and a moving member 18B and a linear motor 13B having a stationary member 19A and a moving member 19B. The linear motors 12A and 12B for the X-axis are moving magnet type linear motors similar to the linear motors 8A and 8B shown in FIG. 1. The linear motors 13A and 13B for the Y-axis are similar in structure to the linear motors 8A and 8B shown in FIG. 1, although the linear motors 13A and 13B lie sideways. A detailed description of the linear motors 12A, 12B, 13A and 13B is omitted.

The stationary members 16A and 17A, which include the respective coils of the linear motors 12A and 12B for the X-axis, are fixed along both ends, respectively, in the direction Y of the wafer base WB. The moving members 16B and 17B are secured to the X-stage 11X through respective securing plates 41A and 41B. The stationary members 18A and 19A, which include the respective coils of the linear motors 13A and 13B for the Y-axis, are secured to the sides of the X-stage 11X, and the moving members 18B and 19B are secured directly to the sides of the Y-stage 11Y. The stationary members 16A, 17A, 18A and 19A are each provided with a jacket which covers the exterior of the corresponding stationary member, and in which a fluid for absorbing heat from the coils circulates, as in the case of the linear motors 8A and 8B shown in FIG. 1. A temperature-controlled fluid is supplied to the stationary members 16A, 17A, 18A and 19A in parallel from a temperature controller 6A installed outside the wafer stage. In FIG. 2, piping for circulating the fluid is shown by the lines, and the flow direction of the fluid is shown by the arrows.

The fluid temperature-controlled in the temperature controller 6A flows into a delivery piping 42. The delivery piping 42 is branched into two pipings 42X and 42Y. The pipings 42X and 42Y are each further branched into two b ranch pipes. The fluid flowing into the piping 42X from the delivery piping 42 passes via the two branch pipes, which are branched from the piping 42X, and flows into the respective inlets of the jackets of the two stationary members 16A and 17A for the X-stage 11X. The fluid absorbing heat from the coils of the stationary member 16A is discharged from the outlet of the jacket. Thereafter, the fluid flows through a branch pipe connected to the jacket and joins the fluid from a piping 43Y (described later) in a piping 44 connected to the branch pipe. On the other hand, the fluid absorbing heat from the coils of the stationary member 17A is discharged from the outlet of the jacket. Thereafter, the fluid flows via a branch pipe connected to the jacket and joins the fluid from the piping 44. Then, the fluid is returned to the temperature controller 6A through a discharge piping 43.

Similarly, the fluid flowing into the piping 42Y from the delivery piping 42 passes through the two branch pipes, which are branched from the piping 42Y, and flows into the inlets of the jackets of the two stationary members 18A and 19A for the Y-stage 11Y. After absorbing heat from the coils of the stationary members 18A and 19A, the fluid is discharged from the outlets of the jackets and then joins the piping 43Y via branch pipes respectively connected to the jackets. Thereafter, the fluid flows via the piping 44 and joins the discharge piping 43, thereby being returned to the temperature controller 6A. The fluid returned to the temperature controller 6A is controlled to a predetermined temperature by the temperature controller 6A and then recirculated to control the temperature of each of the stationary members 16A to 19A.

In this case, as shown in FIG. 2, the fluid inlets of the stationary members 16A and 17A of the linear motors 12A and 12B for the X-stage 11X are provided on an end of the linear motors 12A and 12B closer to the optical path of the laser beam 14X from the laser interferometer 14A for the X-axis. Similarly, the fluid inlets of the stationary members 18A and 19A of the linear motors 13A and 13B for the Y-stage 11Y are provided on an end of the linear motors 13A and 13B closer to the optical path of the laser beam 15Y from the laser interferometer 15A for the Y-axis. A temperature sensor 45A for measuring the temperature of the fluid supplied from the temperature controller 6A is provided near the outlet of the temperature controller 6A that is communicated with the delivery piping 42. A temperature sensor 45B for measuring the temperature of the fluid flowing into the temperature controller 6A is provided near the inlet of the temperature controller 6A that is communicated with the discharge piping 43. Results of measurement by the temperature sensors 45A and 45B are supplied to a control system incorporated in the temperature controller 6A. In addition, a temperature sensor (not shown) is provided for the laser interferometer 14A for the X-axis to detect the temperature around the optical path of the laser beam 14X from the laser interferometer 14A, and a temperature sensor (not shown) is provided for the laser interferometer 15A for the Y-axis to detect the temperature around the optical path of the laser beam 15Y from the laser interferometer 15A. An air-conditioning system (not shown) controls the temperature of air for overall air conditioning on the basis of results of measurement by the two temperature sensors for the laser interferometers 14A and 15A.

It should be noted that a temperature sensor for measuring the fluid temperature may be provided near the inlet of each of the stationary members 16A to 19A as in the case of the embodiment shown in FIG. 1. It is also possible to provide a flow control valve in each of the branch pipes connected to the jackets of the stationary members 16A to 19A to thereby control the flow rate of fluid supplied to each of the stationary members 16A to 19A.

It should be noted that the wafer stage according to this embodiment is a hydrostatic gas bearing type stage. An air guide 20A serving as a guide surface is provided between the X-stage 11X and the linear motor 12A, and a hydrostatic gas bearing is provided on a side of the X-stage 11X that faces the air guide 20A. Air controlled to a predetermined pressure is blown out from an air outlet 20B of the hydrostatic gas bearing over the side of the air guide 20A which faces the hydrostatic gas bearing, and air is sucked through an air inlet 20C provided in side-by-side relation to the air outlet 20B. Air outlets and inlets are alternately provided over the side of the X-stage 11X. Thus, a constant gap is maintained between the X-stage 11X and the air guide 20A by the balance of repulsion force produced by air blowoff and suction force. A similar hydrostatic gas bearing is provided on the bottom of the X-stage 11X to maintain a constant gap between the X-stage 11X and the wafer base WB.

The operation of the stage apparatus according to this embodiment will be briefly described below.

In this embodiment also, the fluid inlets of the jackets of all the stationary members 16A to 19A, which are heat-producing members, are provided on a side thereof closer to the optical path of the laser beam from the laser interferometer. Moreover, the temperature of the fluid supplied into the jacket of each of the stationary members 16A to 19A is set to a level approximately the same as the desired temperature at the optical path of the laser beam from the laser interferometer. Therefore, it is possible to suppress the occurrence of a positional temperature difference around the optical path of the laser beam 14X from the laser interferometer 14A for the X-axis and the optical path of the laser beam 15Y from the laser interferometer 15A for the Y-axis. However, in the case of a two-axis stage as in this embodiment, one stationary member 17A for the X-stage 11X is disposed to cross directly below the optical path of the laser beam 15Y from the laser interferometer 15A for the Y-axis, as shown in FIG. 2. Therefore, if the temperature and flow rate of the fluid at the inlet of the stationary member 17A are controlled as in the case of the other stationary members 16A, 18A and 19A, the surface temperature of that portion of the stationary member 17A which lies directly below the optical path of the laser beam 15Y rises, and this produces a positional temperature difference. There are some methods usable to cope with this problem. For example, the flow rate of the fluid supplied to the stationary member 17A is set higher than the flow rate of the fluid supplied to the other stationary members 16A, 18A and 19A, thereby reducing the temperature gradient in the longitudinal direction of the stationary member 17A. Alternatively, a recirculation piping used exclusively for the stationary member 17A is provided, and the temperature of only the fluid supplied to the stationary member 17A is set relatively low. Meanwhile, temperature gradients are produced in the longitudinal directions of the linear motors 12A, 12B, 13A and 13B by heat generated from the coils of the stationary members 16A to 19A, and air streams corresponding to the temperature gradients are induced. In this case, unlike the embodiment shown in FIG. 1, the air streams are induced in respective directions intersecting each other. Therefore, the air streams mix with each other and become turbulent. However, after mixing with each other, the air streams flow away from the two laser interferometers 14A and 15A. Accordingly, the air streams in the optical paths of the laser interferometers 14A and 15A are not made so turbulent as they give rise to a problem.

Although in the foregoing embodiment the moving magnet type linear motors 8A and 8B are used, it should be noted that the present invention is similarly applicable to a stage apparatus that uses moving coil type linear motors in which a moving member includes a coil and a stationary member includes a magnetic field-generating member.

According to the above-described stage apparatus, a temperature-controlled fluid is supplied to a linear motor from an end of the linear motor closer to the optical path of a light beam emitted from a laser interferometer. Therefore, it is possible to suppress an atmospheric temperature change in a place close to the optical path of the light beam from the laser interferometer, which is caused by heat generated from the linear motor, and thus errors in the measurement by the laser interferometer due to fluctuations of air are reduced. Accordingly, the position of the movable member can be accurately measured. Moreover, an air stream in the vicinity of the stage flows from an end of the linear motor closer to the laser interferometer toward the other end thereof. Usually, the whole stage apparatus is placed in an overall air-conditioned environment, and the system is so set that an air stream produced by the overall air conditioning (the air stream will be hereinafter referred to as "environmental air stream") flows toward the stage apparatus along the direction of the light beam emitted from the laser interferometer. Accordingly, the flow direction of an air stream induced by a temperature gradient on the surface of the linear motor is coincident with the flow direction of the environmental air stream. Therefore, turbulence of the air stream will not occur. Thus, the environmental temperature in a place close to the optical path of the light beam from the laser interferometer can be maintained at a constant value. Consequently, fluctuations of air in the optical path of the light beam reduce, and the position of the movable member can be measured with high accuracy.

In a case where a plurality of linear motors are provided to drive the movable member in a predetermined direction, it is preferable for the fluid supply device to supply the temperature-controlled fluid to the linear motors in parallel from an end of each linear motor closer to the optical path of the light beam emitted from the laser interferometer. By doing so, similar temperature gradients occur in the respective longitudinal directions of the linear motors. The temperature gradients are such that the temperature gradually rises toward a side of the stage apparatus where no laser interferometer is installed. Accordingly, air streams induced by the temperature gradients orderly flow in the same direction as the flow direction of the environmental air stream. Thus, fluctuations of air in the optical path of the light beam are favorably suppressed.

In a case where the linear motors are moving magnet type linear motors, because the driving coils are incorporated in the stationary members, it is favorably easy to route piping for supplying a fluid to the driving coils.

Next, an embodiment of a stage apparatus according to another aspect of the present invention will be described. In the following embodiment, the present invention is applied to a wafer stage of an exposure system.

Figure 4:
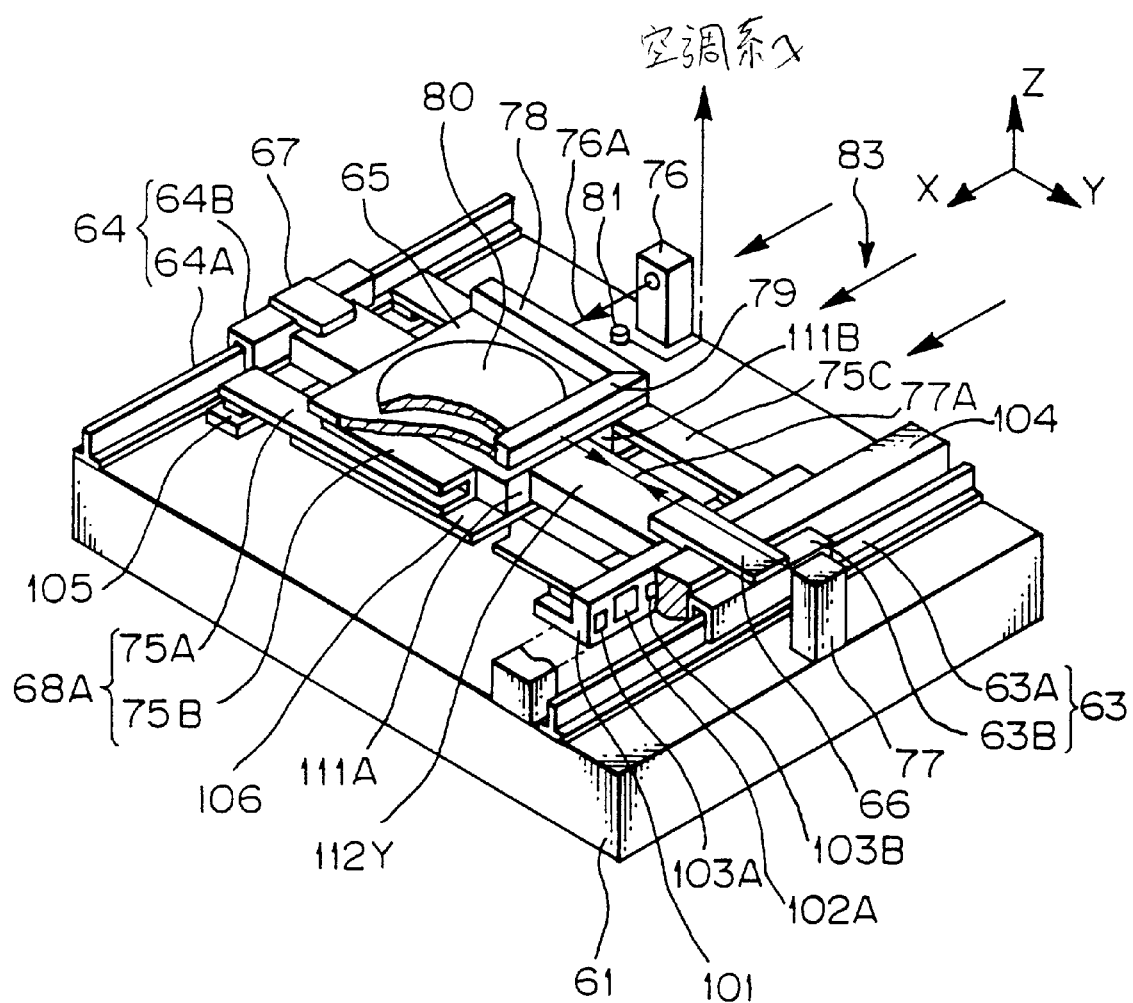
FIG. 4 is a partially-cutaway perspective view showing a wafer stage in an exposure system according to one embodiment of the present invention.

FIG. 4 is a partially-cutaway perspective view for illustrating the arrangement of the wafer stage according to this embodiment. Referring to FIG. 4, a sample table 65 is mounted over a surface plate 61 through X- and Y-stages (described later). A wafer 80 is held by vacuum on a wafer holder (not shown) mounted on the sample table 65. Illuminating light for exposure is applied to a pattern formed on a reticle (not shown), and an image of the pattern is transferred onto the wafer 80. In the following description, an orthogonal coordinate system having X- and Y-axes is defined in a plane parallel to the surface plate 61, and a Z-axis is taken in a direction perpendicular to the orthogonal coordinate system.

Stationary members 63A and 64A of linear motors 63 and 64 for driving the X-stage are secured respectively to the opposite end portions in the direction Y of the surface plate 61 so as to extend in the direction X in parallel to each other. An X-guide bar 104 is secured to the inner side (−Y side) of the stationary member 63A secured to the +Y end portion of the surface plate 61. The X-guide bar 104 is provided with a guide surface for the X-stage. A moving member 63B of the linear motor 63 is disposed to extend over the stationary member 63A. Similarly, a moving member 64B of the linear motor 64 is disposed to extend over the stationary member 64A. The moving member 63B is secured to the top of an end in the direction +Y of a Y-guide bar 112 through a securing frame 66 extending over the X-guide bar 104. The Y-guide bar 112 serves as a guide surface for the Y-stage. The stationary member 64A is secured to the top of an end in the direction −Y of the Y-guide bar 112 through a securing frame 67.

Both ends in the direction Y of the Y-guide bar 112 are secured respectively to a first Y-guide bar transport member 101 disposed at the +Y end of the surface plate 61 and a second Y-guide bar transport member 105 disposed at the −Y end of the surface plate 61. The bottom of the first Y-guide bar transport member 101 faces the top of the surface plate 61, and the outer surface (i.e. the surface on the +Y side) of the first Y-guide bar transport member 101 faces the guide surface of the X-guide bar 104. The bottom of the second Y-guide bar transport member 105 faces the top of the surface plate 61. The X-stage is constructed of the X-guide bar 104, the Y-guide bar 112, the Y-guide bar transport member 101, the Y-guide bar transport member 105, etc. The X-stage moves in the direction X together with the moving members 63B and 64B of the linear motors 63 and 64 for the X-axis as one unit.

The surface of the Y-guide bar transport member 101 that faces the X-guide bar 104 is provided with a plurality of gas outlet and suction portions constituting a hydrostatic gas bearing. Slits are formed in the gas outlet and suction portions of the hydrostatic gas bearing. Blowoff and suction of air are carried out through the slits. Of the plurality of gas outlet and suction portions, one gas outlet portion 102A and two suction portions 103A and 103B are shown in FIG. 4. The Y-guide bar transport member 101 is restrained while maintaining a constant gap between it and the X-guide bar 104 by the balance of repulsion force due to air pressure produced at the gas outlet portion 102A and suction force produced at the suction portions 103A and 103B. A similar hydrostatic gas bearing is provided on the surface of the Y-guide bar transport member 101 that faces the surface plate 61. Thus, the Y-guide bar transport member 101 is restrained while maintaining a constant gap between it and the surface plate 61. Further, a similar hydrostatic gas bearing is provided on the surface of the Y-guide bar transport member 105 that faces the surface plate 61. Thus, the Y-guide bar transport member 105 is restrained while maintaining a constant gap between it and the surface plate 61.

The wafer stage further has two linear motors for the Y-axis to drive X-direction bearing members 111A and 111B through which the sample table 65 is mounted over the surface plate 61 (in FIG. 4, only one linear motor 68A is shown; for the other linear motor, only the stationary member thereof is shown). The stationary member 75A of the linear motor 68A for the Y-axis is secured at one end thereof to one end of the Y-guide bar transport member 101 and at the other end thereof to one end of the Y-guide bar transport member 105. The stationary member 75C of the other linear motor for the Y-axis is secured at one end thereof to the other end of the Y-guide bar transport member 101 and at the other end thereof to the other end of the Y-guide bar transport member 105. The stationary members 75A and 75C extend parallel to each other. A moving member 75B is disposed to extend over the stationary member 75A of the linear motor 68A. A similar moving member is disposed to extend over the stationary member 75C of the other linear motor. The two moving members (75B and one other) are secured directly to the respective sides of the X-direction bearing members 111A and 111B. The two X-direction bearing members 111A and 111B are both secured at their bottoms to a vertical support member 106 disposed to face the bottom of the Y-guide bar 112. The bottom of the vertical support member 106 faces the top of the surface plate 61. The Y-stage is constructed of the vertical support member 106, the X-direction bearing members 111A and 111B, the sample table 65, etc. The Y-stage moves in the direction Y along the Y-guide bar 112 together with the moving members (75B and one other) of the two linear motors for the Y-axis as one unit.

The surface of the vertical support member 106 that faces the surface plate 61 is provided with a hydrostatic gas bearing having a plurality of gas outlet and suction portions. Thus, the vertical support member 106 is restrained while maintaining a constant gap between it and the surface plate 61. The respective surfaces of the X-direction bearing members 111A and 111B that face the Y-guide bar 112 are provided with hydrostatic gas bearings having only a plurality of gas outlet portions. The X-direction bearing members 111A and 111B each maintain a constant gap between the same and the Y-guide bar 112 by repulsion force produced by air pressure. It should be noted that a sufficiently large gap is provided between the vertical support member 106 and the Y-guide bar 112 and a sufficiently large gap is similarly provided between the sample table 65 and the Y-guide bar 112.

Further, a moving mirror 78 is secured to the −X end of the sample table 65, and another moving mirror 79 is secured to the +Y end of the sample table 65. The moving mirrors 78 and 79 reflect laser beams 76A and 77A emitted respectively from an X-coordinate measuring laser interferometer 76 and a Y-coordinate measuring laser interferometer 77, which are fixed on the surface plate 61. The X- and Y-coordinates of the sample table 65 are detected by the laser interferometers 76 and 77. Further, the stage apparatus according to this embodiment is equipped with a mechanism (not shown) that moves the moving mirrors 78 and 79 and the wafer 80 vertically (in the direction Z) as one unit and also rotate them as one unit around each of the X-, Y- and Z-axes. A temperature sensor 81 is installed in the vicinity of the laser beam 76A emitted from the laser interferometer 76 to measure the temperature in the vicinity of the optical path of the laser beam 76A. The value of temperature measured by the temperature sensor 81 is supplied to an air-conditioning system (not shown). That is, in the stage apparatus according to this embodiment, the whole stage apparatus is placed in an air-conditioned environment to maintain at a constant temperature the temperatures at the optical paths of the laser beams 76A and 77A emitted from the laser interferometers 76 and 77 in particular, and thus air for overall air conditioning is supplied toward the stage apparatus from behind the X-coordinate measuring laser interferometer 76 as shown by an environmental air stream 83.

The arrangement of each of the hydrostatic gas bearings provided in the above-described stage apparatus will be described below in detail.

FIG. 5(*a*) is a side view showing the hydrostatic gas bearing provided on the surface of the first Y-guide bar transport member 101 that faces the X-guide bar 104 shown in FIG. 4. Referring to FIG. 5(a), suction portions 103A and 103C are provided at the right and left ends, respectively, of the surface of the Y-guide bar transport member 101 that faces the X-guide bar 104. The suction portions 103A and 103C are each formed from a rectangular recess slightly longer in the vertical direction. Further, a suction portion 103B is provided in the center of the surface of the Y-guide bar transport member 101 that faces the X-guide bar 104. The suction portion 103B is formed from a relatively large rectangular recess longer in the horizontal direction. Two gas outlet portions 102A and 102B are respectively provided between the suction portions 103A and 103B and between the suction portions 103B and 103C. The gas outlet portions 102A and 102B are each formed from a circular recess.

Figure 6:
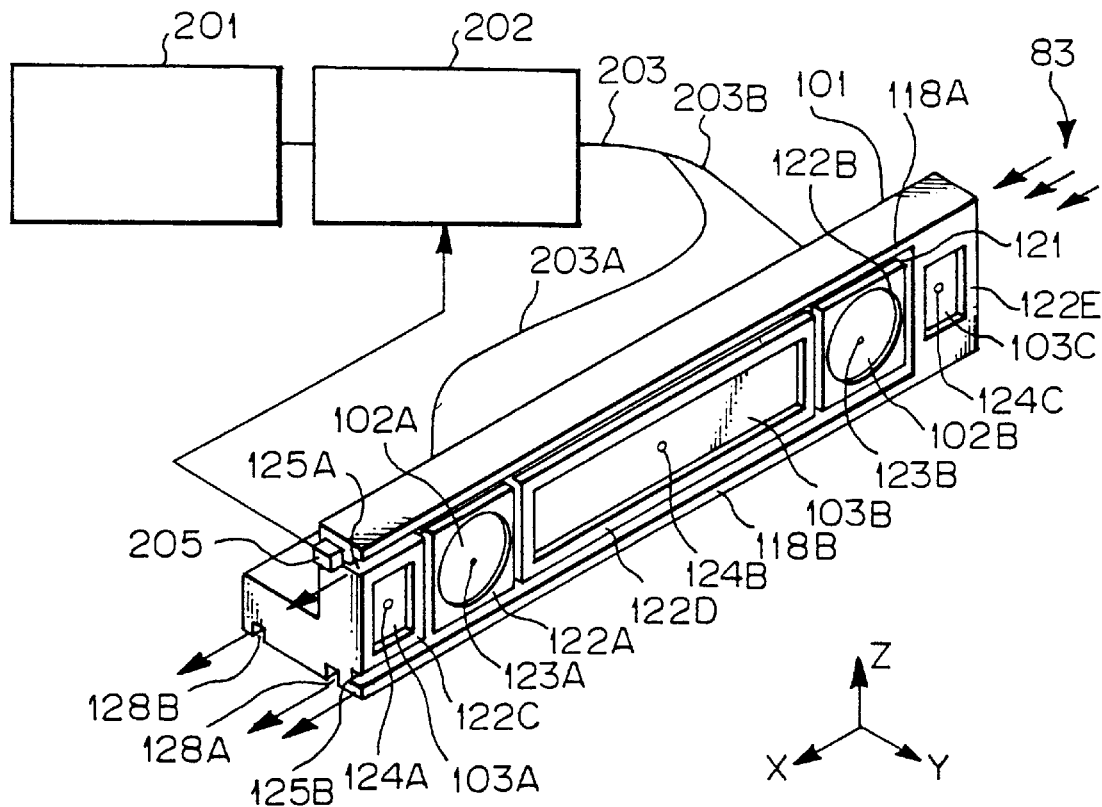
FIG. 6 is a perspective view showing the arrangement of a hydrostatic gas bearing of a first Y-guide bar transport member shown in FIG. 4, together with arrangements in the vicinity of bearing surfaces of the hydrostatic gas bearing.

FIG. 6 is an enlarged perspective view of the Y-guide bar transport member 101 shown in FIG. 4. In FIG. 6, the configuration of the side surface of the Y-guide bar transport member 101 is shown as an enlargement of the configuration shown in FIG. 5(a). Referring to FIG. 6, the gas outlet portions 102A and 102B are circular recesses which are slightly recessed from bearing surfaces 122A and 122B flush with each other (the expression that surfaces A and B are "flush" with each other means that the surface B is on the extension of the surface A). Small air outlet openings 123A and 123B are provided in the respective centers of the gas outlet portions 102A and 102B. The suction portions 103A to 103C are formed in respective bearing surfaces 122C to 122E which are flush with the bearing surfaces 122A and 122B. Exhaust openings 124A to 124C for suction of air are provided in the respective centers of the suction portions 103A to 103C.

Exhaust grooves 121 for discharging air are formed around the gas outlet portions 102A and 102B. The exhaust grooves 121 are formed from recesses having a U-shaped sectional configuration. The exhaust grooves 121 include a plurality of vertical grooves (extending in the direction Z) defined between the bearing surfaces 122A and 122B, the bearing surfaces 122C to 122E, and partition walls 118A and 118B which are formed at both ends in the direction Z of the Y-guide bar transport member 101, and a pair of upper and lower grooves extending in the direction X to communicate with the vertical grooves. In this case, the surfaces of the partition walls 118A and 118B are flush with the bearing surfaces 122A and 122B and connect with the bearing surface 122E. In other words, the −X ends of the two grooves parallel to the X-axis, which constitute the exhaust grooves 121, are closed. On the other hand, the +X ends of the exhaust grooves 121 are open to the outside air. Air flowing into the exhaust grooves 121 is released to the outside from discharge openings 125A and 125B at the +X ends of the pair of upper and lower grooves extending in the direction X, which constitute the exhaust grooves 121.

Compressed air from a compressed gas source 201, which is a compressor installed outside the stage apparatus, is supplied via a centralized piping 203 and two branch pipes 203A and 203B branched from the centralized piping 203 and blown out from the air outlet openings 123A and 123B in the gas outlet portions 102A and 102B. A temperature controller 202 for controlling the temperature of compressed air is installed in the centralized piping 203. Thus, the temperature controller 202 controls the temperature of air pressurized in the compressed gas source 201. An electric output type temperature sensor 205 is provided at the discharge opening 125A to measure the temperature of discharged air. The value of temperature measured by the temperature sensor 205 is supplied to the temperature controller 202.

FIG. 5(e) shows the arrangement of a hydrostatic gas bearing provided on each of the bottoms of the Y-guide bar transport members 101 and 105 and the vertical support member 106, which contact the surface plate 61. As shown in FIG. 5(e), the bottom of the Y-guide bar transport member 101 is also provided with a hydrostatic gas bearing similar to that provided on the side thereof. Air discharged from exhaust grooves 127A, which extend along both ends in the direction Y of the bottom of the Y-guide bar transport member 101, is also discharged in the direction +X from discharge openings 128A and 128B provided on the bottom of the Y-guide bar transport member 101 as in the case of air discharged from the side thereof as shown in FIG. 6. It should be noted that the hydrostatic gas bearing on the bottom is supplied with temperature-controlled air through the branch pipes 203A and 203B as in the case of the hydrostatic gas bearing on the side.

As shown in FIG. 5(e), the hydrostatic gas bearing provided on the bottom of the second Y-guide bar transport member 105 also has an arrangement similar to that of the hydrostatic gas bearing provided on the bottom of the first Y-guide bar transport member 101. Air discharged from exhaust grooves 129A extending along both ends in the direction Y of the bottom of the Y-guide bar transport member 105 is also discharged in the direction +X from discharge openings 130A and 130B. It should be noted that the hydrostatic gas bearing provided on the bottom of the Y-guide bar transport member 105 is also supplied with air pressurized to a predetermined level in the compressed gas source 201 and temperature-controlled in the temperature controller 202. The same is true of other hydrostatic gas bearing described below.

Figure 7:
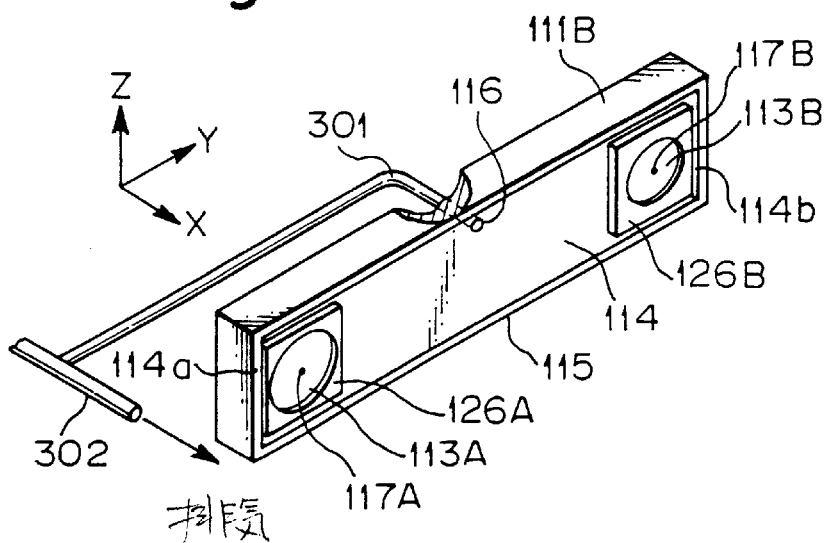
FIG. 7 is a partially-cutaway perspective view showing the arrangement of a hydrostatic gas bearing of an X-direction bearing member.

FIG. 5(b) is a plan view for illustrating the arrangement in the vicinity of the Y-guide bar 112, and FIG. 5(c) shows the bearing surface of the X-direction bearing member 111B that contacts the Y-guide bar 112. FIG. 7 is a partially-cutaway perspective view of the X-direction bearing member 111B shown in FIG. 5(c). The arrangement of the hydrostatic gas bearing provided on the side of the X-direction bearing member 111B, together with the flow of discharged air, will be described below with reference to FIGS. 5(b), 5(c) and 7. The other X-direction bearing member 111A also has a similar arrangement. As shown in FIG. 5(c), a partition wall 115 is provided on the side of the X-direction bearing member 111B where the bearing surface of the hydrostatic gas bearing is provided. The partition wall 115 surrounds the edges of the side of the X-direction bearing member 111B. The X-direction bearing member 111B has gas outlet portions 113A and 113B for blowing out air, which are provided respectively at both ends in the direction Y inside the partition wall 115. An exhaust opening 116 for spontaneously discharging air is provided in the +Z end portion of the X-direction bearing member 111B between the gas outlet portions 113A and 113B.

As shown in FIG. 7, the gas outlet portions 113A and 113B of the X-direction bearing member 111B are formed from circular recesses provided in the respective centers of approximately square bearing surfaces 126A and 126B. Outlet openings 117A and 117B for blowing out air are formed in approximately central portions of the gas outlet portions 113A and 113B, respectively. The outlet openings 117A and 117B are connected to a compressed gas source (not shown). Exhaust grooves 114a and 114b are formed so as to surround the bearing surfaces 126A and 126B, respectively, around the outlet openings 117A and 117B. The exhaust grooves 114a and 114b are contiguous with a central recess 114. The partition wall 115 surrounding the exhaust grooves 114a and 114b and the recess 114 is flush with the bearing surfaces 126A and 126B. The exhaust opening 116, which is provided in the recess 114 lying between the partition wall 115 and the bearing surfaces 126A and 126B, extends through the X-direction bearing member 111B from the top to the bottom thereof and connects with an exhaust pipe 301 at the bottom of the X-direction bearing member 111B. The exhaust pipe 301 is drawn out in the direction −X from the central portion of the X-direction bearing member 111B. Thereafter, the exhaust pipe 301 is bent at right angles to extend straight in the direction −Y. Then, as shown in FIG. 5(b), the exhaust pipe 301 connects with an exhaust pipe 302 extending from the hydrostatic gas bearing of the vertical support member 106 (described later). Discharged air introduced into the exhaust pipe 301 joins discharged air from the hydrostatic gas bearing of the vertical support member 106 in the exhaust pipe 302 and is then discharged into the outside air in the direction +X from the discharge opening of the exhaust pipe 302. It should be noted that discharged air from the other X-direction bearing member 111A also joins the exhaust pipe 302 downstream the confluence of the exhaust pipe 301 and the exhaust pipe 302 and is then discharged together with the discharged air from the X-direction bearing member 111B. In this case, the discharge opening of the exhaust pipe 302 faces in the direction +X. Thus, the discharged air is released in the direction +X, that is, toward the lee side of the environmental air stream 83.

The following is a description of the arrangement of the hydrostatic gas bearing provided on the bottom of the vertical support member 106 for the Y-stage, which contacts the surface plate 61. Referring to FIG. 5(e), the bottom of the vertical support member 106 is provided with four gas outlet portions 107A to 107D having the same arrangement. As will be seen from the arrangement around the gas outlet portion 107A, a suction portion 108 is provided to surround the gas outlet portion 107A. An exhaust groove 109 is provided between the bearing surface around the gas outlet portion 107A and the suction portion 108. An exhaust opening 110 extends from the bottom of the exhaust groove 109 to the top of the vertical support member 106. The exhaust opening 110 connects with an exhaust pipe [see FIG. 5(d)] at the bottom side thereof. Air jetted out from the gas outlet portion 107A is introduced into the exhaust pipe through the exhaust opening 110 and is then released to the outside from the discharge opening of the exhaust pipe together with discharged air from the other gas outlet portions 107B to 107D.

FIG. 5(d) is a side view of the arrangement shown in FIG. 5 (b). As shown by the arrows in FIGS. 5(b) and 5(d), discharged air from the hydrostatic gas bearing on the bottom of the vertical support member 106 comes out from the top of the vertical support member 106, flows through the exhaust pipe bent in the direction −Y, joins the exhaust pipe 302 shown in FIG. 7, and is then released toward the lee side of the environmental air stream 83 from the discharge opening of the exhaust pipe 302 that faces in the direction +X.

Next, structural advantages of the hydrostatic gas bearings according to this embodiment will be described with regard to the hydrostatic gas bearing provided on the side of the first Y-guide bar transport member 101 by way of example. As shown in FIG. 6, exhaust grooves 121 are provided around the gas outlet portions 102A and 102B, and partition walls 118A and 118B flush with the bearing surfaces 122A and 122B are provided at the upper and lower ends, respectively, of the side of the Y-guide bar transport member 101, that is, outside the exhaust grooves 121 extending in the direction X. A part of air blown out from the gas outlet portions 102A and 102B is sucked through the suction portions 103A and 103B, and a part of the air is released to the surroundings from the gap between the X-guide bar 104 and the partition walls 118A and 118B. However, most of the discharged air is blocked by the partition walls 118A and 118B and released to the outside from the discharge openings 125A and 125B through the exhaust grooves 121. It has been experimentally confirmed that when the amount of air blown out from the gas outlet portions 102A and 102B is 3 liters per minute, and the gap between the Y-guide bar transport member 101 and the X-guide bar 104 is 5 micrometers, and further that the sectional area of the exhaust grooves 121 is 5×3 mm2, no air is discharged from the discharge openings 125A and 125B, and the amount of gas flowing out to the outside through the gap between the X-guide bar 104 and the partition walls 118A and 118B outside the exhaust grooves 121 is not more than 1% of the total amount of exhaust gas.

Moreover, in this embodiment the discharge opening for air discharged from each hydrostatic gas bearing is provided at a position as away from the optical paths of the laser beams 76A and 77A as possible, which are emitted from the laser interferometers 76 and 77 as shown in FIG. 4, and discharged air from all the hydrostatic gas bearings is released toward the lee side of the environmental air stream 83. Accordingly, it is possible to suppress the phenomenon that the flow of the environmental air stream 83 is made turbulent by the discharged air from each hydrostatic gas bearing. In this embodiment in particular, discharged air from each of the hydrostatic gas bearings provided on the X-direction bearing members 111A and 111B and the vertical support member 106, which move near the optical pats of the laser beams 76A and 77A from the laser interferometers 76 and 77, is collected into the exhaust pipe 302 shown in FIG. 7, and the discharge opening of the exhaust pipe 302 is provided at the farthest position from the optical paths of the laser beams 76A and 77A. Accordingly, it is possible to minimize the effect of discharged air on a temperature change of air in the optical paths of the laser beams 76A and 77A.

Moreover, in this embodiment, the environmental temperature is measured by the temperature sensor 81 installed in the vicinity of the optical path of the laser beam 76A from the laser interferometer 76, and control is effected on the basis of the result of measurement by the temperature sensor 81 such that the temperature of air supplied from the air-conditioning system to the exposure system becomes equal to a predetermined target temperature. On the hydrostatic gas bearing side, the temperature controller 202 shown in FIG. 6 effects control such that the temperature of discharged air measured by the temperature sensor 205 installed at the discharge opening 125A of the exhaust grooves 121 on the first Y-guide bar transport member 101 becomes equal to the desired temperature of the environmental air. Thus, it is possible to suppress a temperature change of air in the optical path of the laser beam caused by the air discharged from the first Y-guide bar transport member 101. The hydrostatic gas bearings of the second Y-guide bar transport member 105 and the X-direction bearing members 111A and 111B are also supplied with air temperature-controlled in the same way as in the case of the air supplied to the first Y-guide bar transport member 101.

Although in this embodiment the temperature in the optical path of the laser beam 77A from the laser interferometer 77 for the Y-axis is not measured, it is possible to provide a temperature sensor for measuring the environmental temperature around the optical path of the laser beam 77A and to control the temperature, the air volume, etc. in the air-conditioning system (not shown) by taking into consideration the value of temperature measured by the temperature sensor. It is also possible to provide a temperature sensor similar to the temperature sensor 205 for the first Y-guide bar transport member 101 at the outlet of the exhaust groove of each hydrostatic gas bearing and to control individually the temperature of air supplied to each hydrostatic gas bearing on the basis of the value of temperature measured by the temperature sensor.

It should be noted that the present invention is applicable not only to the above-described wafer stage but also to a reticle stage of a step-and-scan type exposure system and so forth. The present invention is also applicable to stage apparatuses used in machine tools and measuring machines.

According to the above-described stage apparatus, an exhaust groove is provided around a gas outlet of a hydrostatic gas bearing, and an exhaust gas, for example, is led to and discharged at a desired position. By virtue of this structure, the amount of gas discharged irregularly to the surroundings of the bearing surface reduces, and the rate of contamination of the stage apparatus by contaminants in the exhaust gas reduces. Moreover, the environmental temperature change is favorably suppressed.

In a case where the bearing surface is provided with partition walls flush with the bearing surface such that the partition walls face each other across the exhaust groove, the amount of gas released directly to the surroundings from a gap between the guide surface of the first member and the bearing surface of the second member further reduces, advantageously.

In a case where a temperature-controlled gas stream is supplied to the stage apparatus in a predetermined direction, and the discharge opening of the exhaust groove is provided on the leeward of the temperature-controlled gas stream, the turbulence of the external gas stream caused by the gas discharged from the exhaust groove favorably reduces.

The stage apparatus may be arranged such that a temperature sensor is provided to measure the temperature of the gas discharged from the exhaust groove, and the temperature of a compressed air source for the hydrostatic gas bearing is controlled on the basis of the value of temperature measured by the temperature sensor such that the temperature of the gas discharged from the exhaust groove becomes equal to the temperature of the temperature-controlled gas stream. In this case, the temperature change of the external gas stream is favorably suppressed because the exhaust gas is discharged at a temperature equal to that of the external gas stream.

The stage apparatus may be provided with an interferometer that applies a light beam to at least one of the first and second members to detect a relative displacement between the two members, and the gas discharged from the exhaust groove may be released to a position away from the optical path of the light beam from the interferometer. In this case, the temperature change in the optical path of the light beam from the interferometer is suppressed, and measuring errors of the interferometer reduce. Accordingly, the first and second members can be positioned relative to each other with high accuracy on the basis of the relative position of the first and second members measured accurately by the interferometer.

It should be noted that the present invention is not necessarily limited to the above-described embodiments, but may adopt various arrangements without departing from the gist of the present invention.

The entire disclosure of Japanese Patent Application No. 8-87826 filed on Apr. 10, 1996 and Japanese Patent Application No. 8-133203 filed on May 28, 1996 including specification, claims, drawings and summary is incorporated herein by reference in their entireties.

What is claimed is:

1. A stage apparatus comprising:

a movable member;

a pair of linear motors that drives said movable member in a predetermined direction;

an interferometer that applies a light beam to said movble member to measure a position of said movable member; and a fluid supply device that supplies a temperature-controlled fluid to driving coils of said pair of linear motors with said interferometer being positioned between supply routes to said driving coils of said temperature-controlled fluid.

2. A stage apparatus according to claim 1, wherein a plurality pair of linear motors are provided to drive said movable member in a plane, and wherein said fluid supply device supplies the temperature-controlled fluid to said driving coils of said plurality pair of linear motors in parallel.

3. A stage apparatus according to claim 1, wherein said linear motor is a moving magnet type linear motor.

4. A stage apparatus according to claim 1, further comprising a thermometer which takes the temperature of said fluid.

5. A stage control method comprising the steps of:

driving a movable member in a predetermined direction by a pair of linear motors;

measuring a position of said movable member by an interferometer; and supplying a temperature-controlled fluid to driving coils of said pair of linear motors with said interferometer being positioned between supply routes to said driving coils of said temperature-controlled fluid.

6. A stage control method according to claim 5, comprising the steps of:

driving said movable member in a plane by a plurality pair of linear motors; and supplying said temperature-controlled fluid to said driving coils of linear motors in parallel.

7. A stage control method according to claim 5, further comprising the step of measuring a temperature of said fluid.

8. A stage apparatus comprising:

a first member having a guide surface;

a stage which is movable along said guide surface;

a hydrostatic gas bearing that blows gas over said guide surface from a gas outlet, said hydrostatic gas bearing being provided on said stage;

an interferometer which detects a position of said stage; and an exhaust member which exhausts said gas to a position in which the exhausted gas does not have an effect on said detection by said interferometer.

9. A stage apparatus according to claim 8, wherein a temperature-controlled gas stream is supplied to said stage apparatus in a predetermined direction, and wherein a discharge opening of said exhaust groove is provided on leeward of said temperature-controlled gas stream.

10. A stage apparatus according to claim 9, further comprising:

a temperature sensor that measures a temperature of a gas discharged from said exhaust groove, wherein a temperature of a compressed gas source for said hydrostatic gas bearing is controlled on a basis of a value of temperature measured by said temperature sensor such that the temperature of said gas discharged from said exhaust groove becomes equal to a temperature of said temperature-controlled gas stream.

11. A stage apparatus to claim 8, wherein said exhaust member includes an exhaust groove.

12. A stage apparatus according to claim 11, wherein a bearing surface is provided on said hydrostatic gas bearing.

13. A stage apparatus according to claim 12, further comprising partition walls such that said exhaust groove is positioned between said bearing surface and said partition walls, said partition walls being flush with said bearing surface.

14. A stage apparatus according to claim 8, further comprising an adjustment device which adjusts the gap between said first member and said stage.

15. A stage apparatus according to claim 14, wherein said adjustment device is disposed on said stage.

16. A stage apparatus according to claim 14, wherein said first member and said stage are attracted to each other by said adjustment device.

17. A stage apparatus according to claim 10, wherein said adjustment device includes a vacuum unit, said first member and said stage being attracted to each other by said vacuum unit.

18. A stage apparatus according to claim 14, wherein said adjustment device adjusts the gap between said first member and said stage in cooperation with said hydrostatic gas bearing which blows gas over said guide surface.

19. A method for making an exposure apparatus to transfer a pattern onto an object comprising:

providing a first member which has a first surface;

providing an object stage which moves holding the object;

providing a first gas bearing, said first gas bearing being provided on the object stage and blowing a gas over said first surface;

providing an interferometer which detects a position of the object stage; and providing a first exhaust member, said first exhaust member exhausting said gas to a position in which the exhaust gas does not have an effect on said detection by said interferometer.

20. A method according to claim 19, wherein the first exhaust member comprises a first exhaust groove.

21. A method according to claim 19, wherein a bearing surface is provided on said first gas bearing.

22. A method according to claim 21, further comprising:

providing a partition wall such that said first exhaust groove is positioned between said bearing surface and said partition wall, said partition wall being flush with said bearing surface.

23. A method according to claim 19, further comprising:

providing an adjustment device, said adjustment device adjusting a gap between the first member and the object stage.

24. A method according to claim 23, wherein the adjustment device is mounted on the object stage.

25. A method according to claim 23, wherein the adjustment device attracts the first member and the object stage to each other.

26. A method according to claim 25, wherein the adjustment device comprises a vacuum unit which attracts the first member and the object stage to each other.

27. A method according to claim 23, wherein the adjustment device adjusts the gap between said first member and said object stage in cooperation with said first gas bearing.

28. A method according to claim 19, further comprising:

providing a mask stage which holds a mask on which a pattern is formed;

providing a second member which has a second surface;

providing a second gas bearing, said second gas bearing being provided on said mask stage and blowing a gas over said second surface;

providing a second exhaust member, said second exhaust member discharging said gas along a direction which intersects a direction of blowing said gas from said second gas bearing.

29. A method according to claim 19, wherein the exposure apparatus is a scanning type exposure apparatus.

30. An object on which said pattern has been transferred by an exposure apparatus manufactured by the method according to claim 19.

* * * * *